United States Patent
Han et al.

(10) Patent No.: US 11,481,122 B2
(45) Date of Patent: Oct. 25, 2022

(54) MEMORY SYSTEM AND OPERATING METHOD THEREOF

(71) Applicant: SK hynix Inc., Icheon-si (KR)

(72) Inventors: Gi Bbeum Han, Icheon-si (KR); Kyung Bum Kim, Icheon-si (KR); Jiman Hong, Icheon-si (KR)

(73) Assignee: SK hynix Inc., Icheon-si (KR)

(*) Notice: Subject to any disclaimer, the term of this patent is extended or adjusted under 35 U.S.C. 154(b) by 0 days.

(21) Appl. No.: 16/915,632

(22) Filed: Jun. 29, 2020

(65) Prior Publication Data

US 2021/0181952 A1 Jun. 17, 2021

(30) Foreign Application Priority Data

Dec. 16, 2019 (KR) .......................... 10-2019-0167795

(51) Int. Cl.
*G06F 3/06* (2006.01)

(52) U.S. Cl.
CPC ............ *G06F 3/0619* (2013.01); *G06F 3/065* (2013.01); *G06F 3/0658* (2013.01); *G06F 3/0679* (2013.01)

(58) Field of Classification Search
CPC ...... G06F 3/0619; G06F 3/065; G06F 3/0658; G06F 3/0679
See application file for complete search history.

(56) References Cited

U.S. PATENT DOCUMENTS

| | | | |
|---|---|---|---|
| 8,572,311 B1* | 10/2013 | Shalvi | G06F 11/1016 711/103 |
| 10,204,699 B2* | 2/2019 | Lin | G11C 29/44 |
| 2007/0016723 A1* | 1/2007 | Shibata | G11C 16/3427 711/103 |
| 2009/0070520 A1* | 3/2009 | Mizushima | G06F 12/0246 711/103 |
| 2015/0149693 A1* | 5/2015 | Ng | G11C 16/10 711/103 |
| 2016/0011930 A1* | 1/2016 | Yeh | G06F 11/073 714/15 |
| 2017/0132125 A1* | 5/2017 | Cai | G06F 11/10 |
| 2018/0018091 A1* | 1/2018 | Shin | G06F 3/0665 |
| 2018/0190362 A1* | 7/2018 | Barndt | G06F 3/0679 |
| 2020/0082890 A1* | 3/2020 | Karr | G06F 3/0617 |
| 2021/0035649 A1* | 2/2021 | Muchherla | G06F 3/0619 |

FOREIGN PATENT DOCUMENTS

| | | |
|---|---|---|
| KR | 101497074 B1 | 3/2015 |
| KR | 1020180079584 A | 7/2018 |

* cited by examiner

*Primary Examiner* — Nanci N Wong
(74) *Attorney, Agent, or Firm* — William Park & Associates Ltd.

(57) ABSTRACT

A memory system, and a method of operating the memory system, includes a memory device including a plurality of memory blocks. The memory system also includes a memory controller for controlling the memory device to perform a data copy operation of moving and storing valid data stored in a selected memory block among the plurality of memory blocks in a target block among the plurality of memory blocks. The memory controller is configured to control the memory device to perform the data copy operation by preferentially selecting a weak page among a plurality of pages included in the selected memory block rather than the other pages.

8 Claims, 10 Drawing Sheets

MEMORY SYSTEM AND OPERATING METHOD THEREOF

CROSS-REFERENCE TO RELATED APPLICATION

The present application claims priority under 35 U.S.C. § 119(a) to Korean patent application number 10-2019-0167795, filed on Dec. 16, 2019, in the Korean Intellectual Property Office, the entire disclosure of which is incorporated herein by reference.

BACKGROUND

1. Technical Field

The present disclosure generally relates to a memory system and an operating method thereof, and more particularly, to a memory system capable of improving the reliability of data and an operating method of the memory system.

2. Related Art

The paradigm on computer environment has recently shifted to a ubiquitous computing environment in which computing systems can be accessed virtually anywhere and anytime. This promotes increasing usage of portable electronic devices such as mobile phones, digital cameras, notebook computers, and the like. Such portable electronic devices may generally include a memory system using a memory device, i.e., a data storage device. The data storage device is used as a main memory device or an auxiliary memory device of the portable electronic devices.

A data storage device using a memory device has excellent stability and durability, high information access speed, and low power consumption, because there is no mechanical driving part. In an example of memory systems having such advantages, the data storage device includes a Universal Serial Bus (USB) memory device, memory cards having various interfaces, a Solid State Drive (SSD), and the like.

SUMMARY

In accordance with an embodiment of the present disclosure, a memory system includes a memory device including a plurality of memory blocks. The memory system also includes a memory controller configured to control the memory device to perform a data copy operation of moving and storing valid data stored in a selected memory block among the plurality of memory blocks in a target block among the plurality of memory blocks. The memory controller is configured to control the memory device to perform the data copy operation by preferentially selecting a weak page among a plurality of pages included in the selected memory block rather than the other pages.

In accordance with another embodiment of the present disclosure, a method for operating a memory system includes: detecting a page in which a read fail occurs in a read operation of a selected memory block; selecting, as weak pages, pages physically adjacent to the page in which the read fail has occurred; performing a first data copy operation of reading first valid data stored in the selected weak pages and storing the read data in a target block; and performing a second data copy operation of reading second valid data stored in the other pages except the weak pages among a plurality of pages included in the selected memory block and storing the read data in the target block, after the first data copy operation is completed.

In accordance with still another embodiment of the present disclosure, a method for operating a memory system includes: checking a read count of each of a plurality of memory blocks; detecting a memory block for which the read count is equal to or higher than a set count; performing a first data copy operation of reading first valid data stored in weak pages among a plurality of pages included in the detected memory block and storing the read data in a target block; and performing a second data copy operation of reading second valid data stored in the other pages except the weak pages among the plurality of pages included in the detected memory block and storing the read data in the target block, after the first data copy operation is completed.

DETAILED DESCRIPTION

The specific structural and functional descriptions disclosed herein are merely illustrative for the purpose of describing embodiments according to the concept of the present disclosure. The embodiments can be implemented in various forms, and should not be construed as limited to the embodiments set forth herein.

Hereinafter, embodiments of the present disclosure will be described in detail with reference to the accompanying drawings in order for those skilled in the art to be able to readily implement the technical spirit of the present disclosure.

In the description, the term "at least one of A or/and B" may include all possible combinations of the items that are enumerated together. For example, the term "at least one of A or/and B" means (1) including at least one A, (2) including at least one B, or (3) including both at least one A and at least one B.

Various embodiments are directed to a memory system capable of improving the reliability of data when valid data stored in a memory block is moved to another memory block for storage. Additional embodiments are directed to an operating method of such a memory system.

Figure 1:
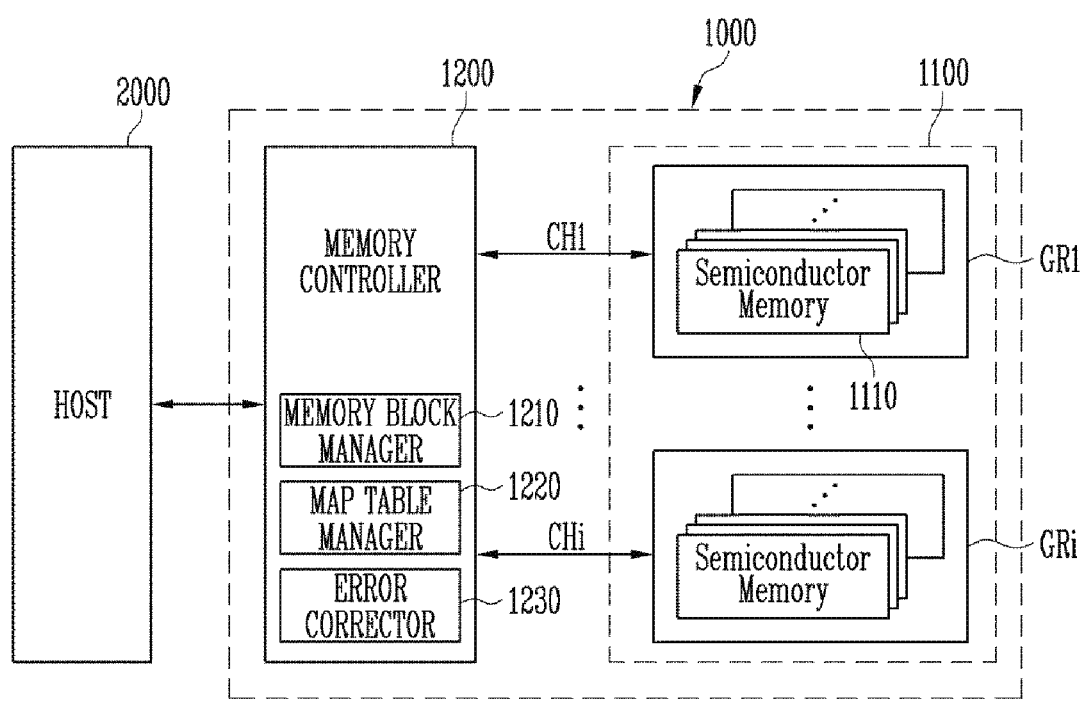
FIG. 1 is a diagram illustrating a memory system in accordance with an embodiment of the present disclosure.

FIG. 1 is a diagram illustrating a memory system 1000 in accordance with an embodiment of the present disclosure.

Referring to FIG. 1, the memory system 1000 includes a memory device 1100 and a memory controller 1200. The memory system 1000 may further include a buffer memory (not shown). The memory device 1100 includes a plurality of semiconductor memories 1110. The plurality of semiconductor memories 1110 may be divided into a plurality of memory groups GR1 to GRi. Each of the plurality of semiconductor memories 1110 may be configured as, for example, a memory chip.

In FIG. 1, a case where the plurality of memory groups GR1 to GRi communicate with the memory controller 1200 respectively through first to ith channels CH1 to CHi is illustrated. Each semiconductor memory 1110 will be described below with reference to FIG. 3.

Each of the plurality of memory groups GR1 to GRi communicates with the memory controller 1200 through one common channel. The memory controller 1200 controls the plurality of semiconductor memories 1110 of the memory device 1100 through the plurality of channels CH to CHi.

Each of the plurality of semiconductor memories 1110 may include a plurality of memory blocks, and perform a data copy operation of copying valid data to be detected as read fail during a read operation or valid data stored in a read reclaim operation from a memory block in which the valid data is stored among the plurality of memory blocks and storing the copied data in a memory block in an erase state. The memory block in which the valid data is stored may be defined as a victim block, and the memory block in the erase state, in which the copied data is stored, may be defined as a target block.

The memory controller 1200 is coupled between a host 2000 and the memory device 1100. The memory controller 1200 accesses the memory device 1100 in response to a request from the host 2000. For example, the memory controller 1200 controls background operations such as read, program, erase, and read reclaim operations of the memory device 1100 in response to a request received from the host 2000. The memory controller 1200 provides an interface between the memory device 1100 and the host 2000. The memory controller 1200 drives firmware for controlling the memory device 1100.

The memory controller 1200 may include a memory block manager 1210, a map table manager 1220, and an error corrector 1230.

The memory block manager 1210 may control the memory device 1100 to perform a defense algorithm such as an eBoost operation, a soft decoding operation, or a read retry operation of re-performing a read operation by changing a read voltage for a page in which a read fail occurs when the read fail occurs in the read operation of the memory device 1100. The memory block manager 1210 may register and manage, as a bad block, a memory block in which the read fail occurs even when the defense algorithm is performed, and the memory block registered as the bad block may be excluded in a subsequent general operation, e.g., a program operation. The memory block manager 1210 may manager a read count of each of the plurality of memory blocks included in the memory device 1100, and control the memory device 1100 to perform a read reclaim operation on a memory block of which the read count is a set number or more. The memory block manager 1210 may control the memory device 1100 to perform a data copy operation, and preferentially select valid data stored in a weak page among a plurality of pages included in a victim block in the data copy operation and then store the selected data in a target block.

The map table manager 1220 may store a map table for matching logical and physical addresses of the memory device 1100, and convert a logical address received from the host 2000 into a physical address of the memory device 1100, based on the stored map table. The map table manager 1220 may update, in the map table, mapping information between logical and physical addresses changed in a data copy operation of copying valid data stored in a victim block and storing the copied data in a target block.

The error corrector 1230 may perform Error Correction Code (ECC) decoding on data received from the memory device 1100 in a read operation. The error corrector 1230 may be configured as one of a plurality of ECC circuits. When a number of error bits included in data received from the memory device 1100 is greater than an allowable error bit number, the error corrector 1230 may determine the data as read fail. Data on which the ECC decoding is successfully performed by the error corrector 1230 may be transmitted to the host 2000.

The memory controller 1200 and the memory device 1100 may be integrated into one semiconductor device. In an embodiment, the memory controller 1200 and the memory device 1100 may be integrated into one semiconductor device, to constitute a memory card. For example, the memory controller 1200 and the memory device 1100 may be integrated into one semiconductor device, to constitute a memory card such as a PC card (Personal Computer Memory Card International Association (PCMCIA)), a Compact Flash (CF) card, a Smart Media Card (SM or SMC), a memory stick, a Multi-Media Card (MMC, RS-MMC or MMCmicro), an SD card (SD, miniSD, microSD or SDHC), or a Universal Flash Storage (UFS).

The memory controller 1200 and the memory device 1100 may be integrated into one semiconductor device to constitute a semiconductor drive (Solid State Drive (SSD)). The semiconductor drive SSD includes a storage device configured to store data in a semiconductor memory. When the memory system 1000 is used as the semiconductor drive (SDD), the operating speed of the host 1400 coupled to the memory system 1000 is remarkably improved.

In another example, the memory system 1000 may be provided as one of various components of an electronic device such as a computer, an Ultra Mobile PC (UMPC), a workstation, a net-book, a Personal Digital Assistant (PDA), a portable computer, a web tablet, a wireless phone, a mobile phone, a smart phone, an e-book, a Portable Multi-Media Player (PMP), a portable game console, a navigation system, a black box, a digital camera, a 3-dimensional television, a digital audio recorder, a digital audio player, a digital picture recorder, a digital picture player, a digital video recorder, a digital video player, a device capable of transmitting/receiving information in a wireless environment, one of various electronic devices that constitute a home network, one of various electronic devices that constitute a computer network, one of various electronic devices that constitute a telematics network, an RFID device, or one of various components that constitute a computing system.

In an embodiment, the memory device 1100 or the memory system 1000 may be packaged in various forms. For example, the memory device 1100 or the memory system 1000 may be packaged in a manner such as Package On Package (PoP), Ball Grid Arrays (BGAs), Chip Scale Packages (CSPs), Plastic Leaded Chip Carrier (PLCC), Plastic Dual In-line Package (PDIP), die in Waffle pack, die in wafer form, Chip On Board (COB), CERamic Dual In-line Package (CERDIP), Plastic Metric Quad Flat Pack (PMQFP), Thin Quad Flat Pack (TQFP), Small Outline Integrated Circuit (SOIC), Shrink Small Outline Package (SSOP), Thin Small Outline Package (TSOP), System In Package (SIP), Multi-Chip Package (MCP), Wafer-level Fabricated Package (WFP), or Wafer-level processed Stack Package (WSP).

Figure 2:
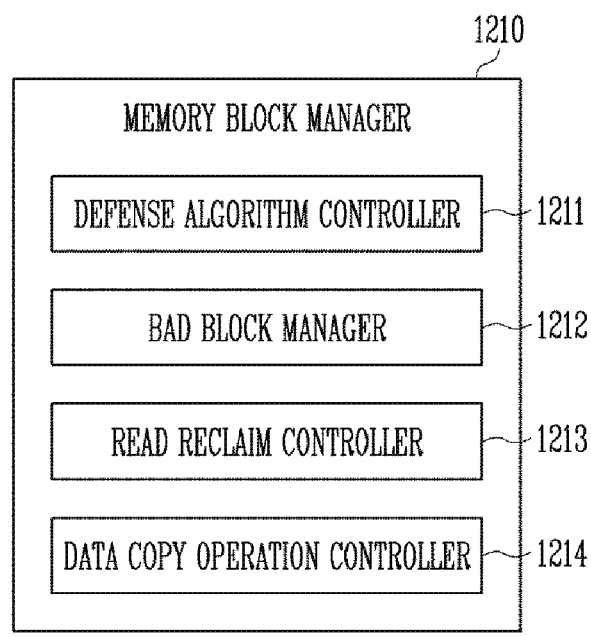
FIG. 2 is a diagram illustrating a memory block manager shown in FIG. 1.

FIG. 2 is a diagram illustrating the memory block manager 1210 shown in FIG. 1.

Referring to FIG. 2, the memory block manager 1210 may include a defense algorithm controller 1211, a bad block manager 1212, a read reclaim controller 1213, and a data copy operation controller 1214.

The defense algorithm controller 1211 may control the memory device (1100 shown in FIG. 1) to perform a defense algorithm such as an eBoost operation, a soft decoding operation, or a read retry operation of re-performing a read operation by changing a read voltage for a page in which a read fail occurs when the page is determined as the read fail by the error corrector (1230 shown in FIG. 1) in the read operation of the memory device 1100.

The bad block manager 1212 may register and manage, as a bad block, a memory block including a page in which a read fail continuously occurs even when the defense algorithm is performed in a read operation. The memory block registered as the bad block may be excluded in a subsequent general operation, e.g., a program operation.

The read reclaim controller 1213 may manager a read count of each of the plurality of memory blocks included in the memory device 1100, and control the memory device 1100 to perform a read reclaim operation on a memory block of which the read count is a set number or more.

The data copy operation controller 1214 may control the memory device 1100 to perform a data copy operation of copying valid data stored in a victim block and storing the copied data in a target block, and preferentially select valid data stored in a weak page among a plurality of pages included in the victim block and then store the selected data in the target block in the data copy operation. The data copy operation may be an operation of moving valid data stored in a memory block including a page in which a read fail occurs to a target block. A weak page may correspond to pages physically adjacent to a page in which a read fail occurs. The data copy operation may be an operation of moving valid data stored in a victim block to a target block in a read reclaim operation. A weak page may correspond to pages adjacent to a bit line, pages adjacent to a source line, or the pages adjacent to the bit line and the pages adjacent to the source line.

Figure 3:
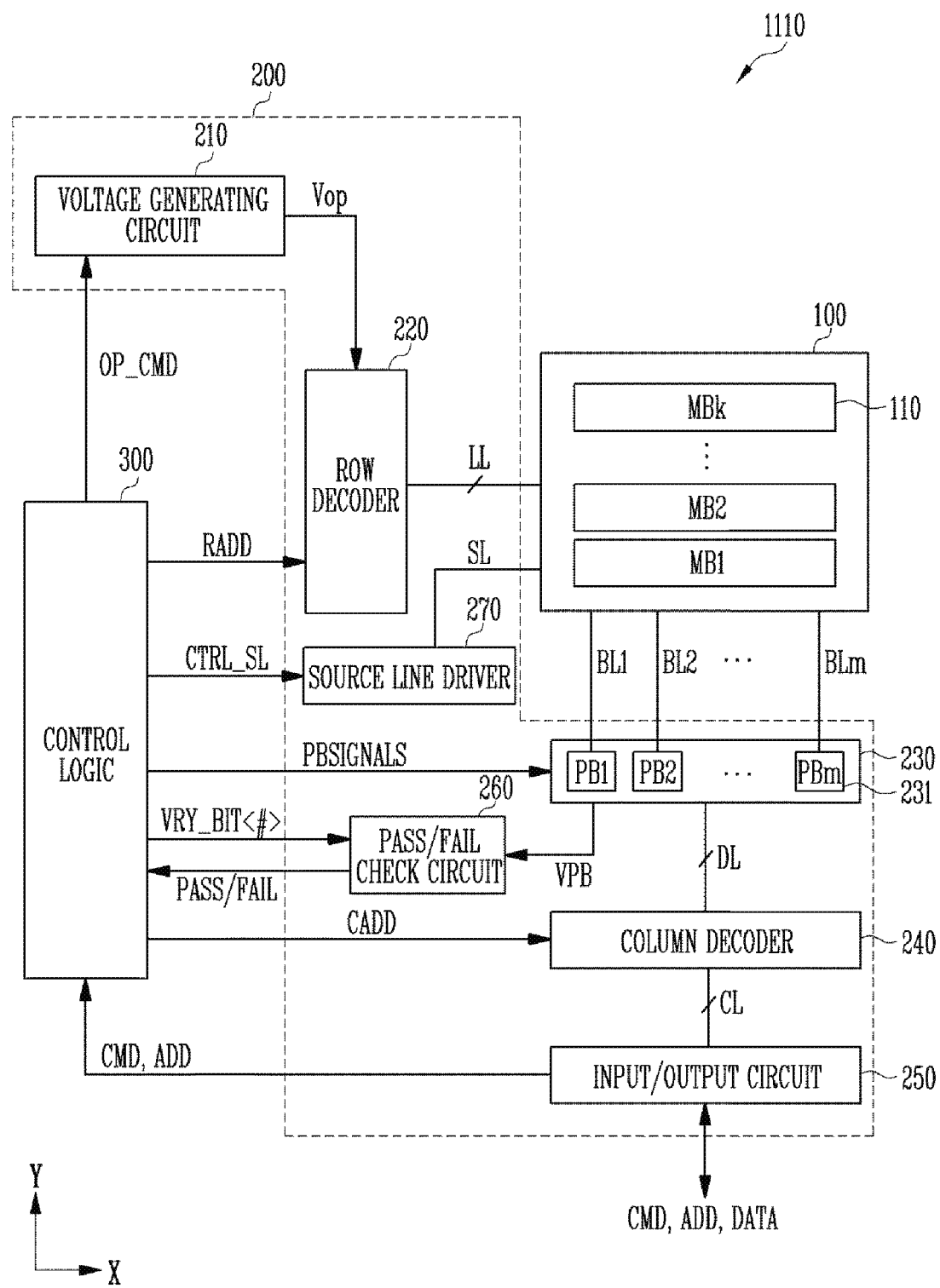
FIG. 3 is a diagram illustrating a semiconductor memory shown in FIG. 1.

FIG. 3 is a diagram illustrating the semiconductor memory 1110 shown in FIG. 1.

Referring to FIG. 3, the semiconductor memory 1110 may include a memory cell array 100 in which data is stored. The semiconductor memory 1110 may include peripheral circuits 200 configured to perform a program operation for storing data in the memory cell array 100, a read operation for outputting the stored data, and an erase operation for erasing the stored data. The semiconductor memory 1110 may include control logic 300 which controls the peripheral circuits 200 under the control of the memory controller (1200 shown in FIG. 1).

The memory cell array 100 may include a plurality of memory blocks MB1 to MBk 110 (k is a positive integer). Local lines LL and bit lines BL1 to BLm (m is a positive integer) may be coupled to each of the memory blocks MB1 to MBk 110. For example, the local lines LL may include a first select line, a second select line, and a plurality of word lines arranged between the first and second select lines. Also, the local lines LL may include dummy lines arranged between the first select line and the word lines and between the second select line and the word lines. The first select line may be a source select line, and the second select line may be a drain select line. For example, the local lines LL may include word lines, drain and source select lines, and source lines SL. For example, the local lines LL may further include dummy lines. For example, the local lines LL may further include pipe lines. The local lines LL may be coupled to each of the memory blocks MB1 to MBk 110, and the bit lines BL1 to BLm may be commonly coupled to the memory blocks MB1 to MBk 110. The memory blocks MB1 to MBk 110 may be implemented in a two-dimensional or three-dimensional structure. For example, memory cells may be arranged in a direction parallel to a substrate in memory blocks 110 having a two-dimensional structure. For example, memory cells may be stacked in a direction vertical to a substrate in memory blocks 110 having a three-dimensional structure.

The peripheral circuits 200 may be configured to perform program, read, and erase operations of a selected memory block 110 under the control of the control logic 300.

For example, the peripheral circuits 200 may include a voltage generating circuit 210, a row decoder 220, a page buffer group 230, a column decoder 240, an input/output circuit 250, a pass/fail check circuit 260, and a source line driver 270.

The voltage generating circuit 210 may generate various operating voltages Vop used for program, read, and erase operations in response to an operation signal OP_CMD. For example, the voltage generating circuit 210 may generate a program voltage, a verify voltage, pass voltages, a read voltage, a source line voltage, and the like under the control of the control logic 300.

The row decoder 220 may transfer the operating voltages Vop to the local lines LL coupled to the selected memory block 110 in response to a row address RADD.

The page buffer group 230 may include a plurality of page buffers PB1 to PBm 231 coupled to the bit lines BL1 to BLm. The page buffers PB1 to PBm 231 may operate in response to page buffer control signals PBSIGNALS. For example, the page buffers PB1 to PBm 231 may temporarily store data received through data lines DL in a program operation and then control voltage levels of the bit lines BL1 to BLm or sense voltages or currents of the bit lines BL1 to BLm in a read or verify operation.

The column decoder 240 may transfer data between the input/output circuit 250 and the page buffer group 230 in response to a column address CADD. For example, the column decoder 240 may exchange data with the page buffers 231 through the data lines DL, or exchange data with the input/output circuit 250 through column lines CL.

The input/output circuit 250 may transfer a command CMD and an address ADD, which are received from the memory controller (1200 shown in FIG. 1), to the control logic 300, or exchange data DATA with the column decoder 240.

In a read operation or verify operation, the pass/fail check circuit 260 may generate a reference current in response to an allow bit VRY_BIT<#>, and output a pass signal PASS or a fail signal FAIL by comparing a sensing voltage VPB received from the page buffer group 230 with a reference voltage generated by the reference current.

The source line driver 270 may be coupled to a memory cell included in the memory cell array 100 through a source line SL, and control a voltage of a source node. In an example, the source line driver 270 may electrically couple the source node of the memory cell to a ground node in a read or verify operation. Also, the source line driver 270 may apply a ground voltage to the source node of the memory cell in a program operation. The source line driver 270 may apply an erase voltage to the source node of the memory cell in an erase operation. The source line driver 270 may receive a source line control signal CTRL_SL from the control logic 300, and control the voltage of the source node, based on the source line control signal CTRL_SL.

The control logic 300 may control the peripheral circuits 200 by outputting the operation signal OP_CMD, the row address ADDR, the page buffer control signals PBSIGNALS, and the allow bit VRY_BIT<#> in response to an internal command CMD and an address ADD. Also, the control logic 300 may determine whether a verify operation has passed or failed in response to the pass or fail signal PASS or FAIL. The control logic 300 may be implemented as hardware, software, or a combination of hardware and software. For example, the control logic 300 may be a control logic circuit operating in accordance with an algorithm and/or a processor executing control logic code.

Figure 4:
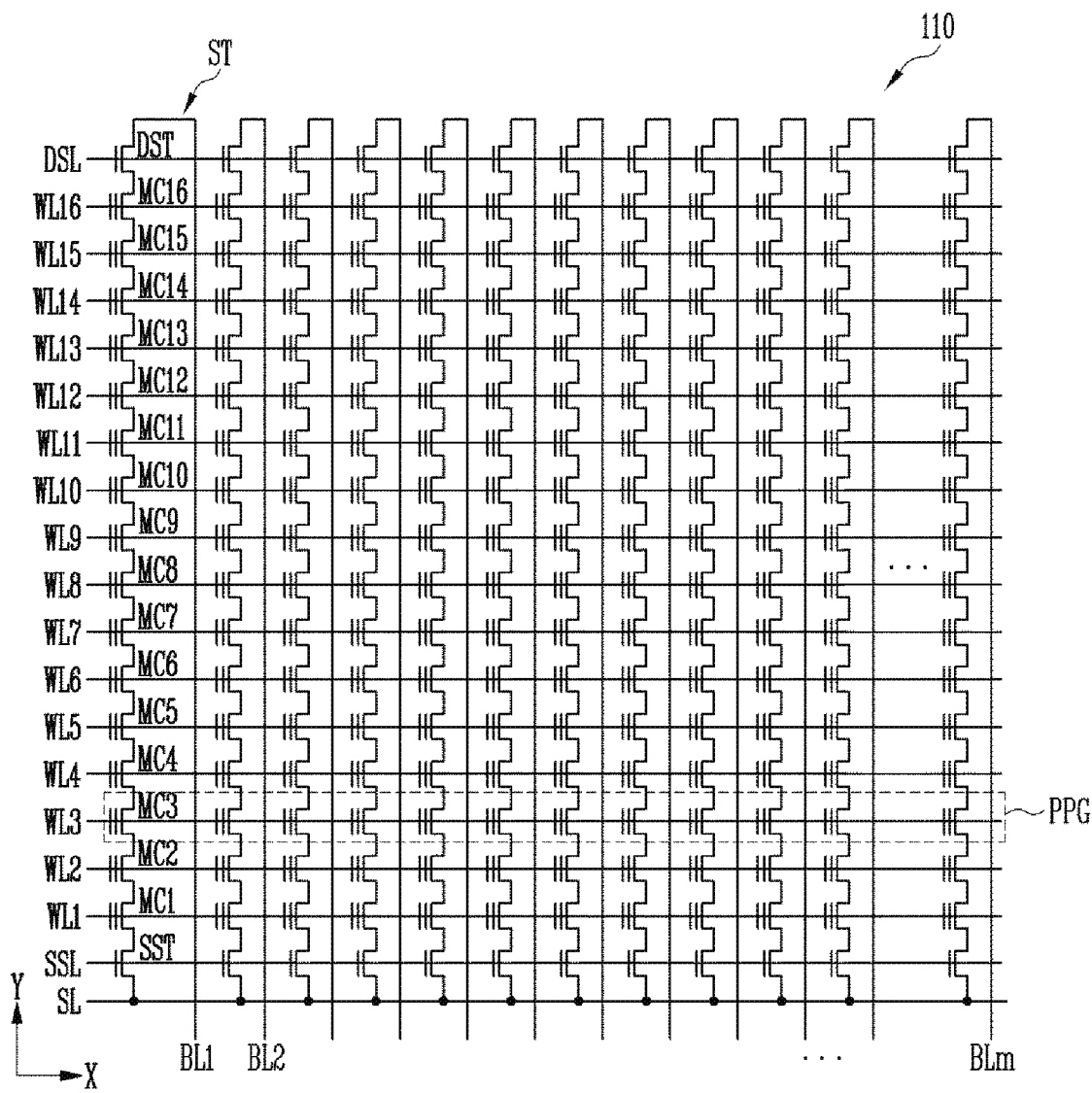
FIG. 4 is a diagram illustrating a memory block shown in FIG. 3.

FIG. 4 is a diagram illustrating the memory block 110 shown in FIG. 3.

Referring to FIG. 4, in the memory block 110, a plurality of word lines arranged in parallel to one another may be coupled between a first select line and a second select line. The first select line may be a source select line SSL, and the second select line may be a drain select line DSL. More specifically, the memory block 110 may include a plurality of strings ST coupled between bit lines BL1 to BLm and a source line SL. The bit lines BL1 to BLm may be coupled to the strings ST, respectively, and the source line SL may be commonly coupled to the strings ST. The strings ST may be configured identically to one another, and therefore, a string ST coupled to a first bit line BL1 will be described in detail as an example.

The string ST may include a source select transistor SST, a plurality of memory cells MC1 to MC16, and a drain select transistor DST, which are coupled in series between the source line SL and the first bit line BL1. At least one source select transistor SST and at least one drain select transistor DST may be included in one string ST, and memory cells of which number is greater than that of the memory cells MC1 to MC16 shown in the drawing may be included in the one string ST.

A source of the source select transistor SST may be coupled to the source line SL, and a drain of the drain select transistor DST may be coupled to the first bit line BL1. The memory cells MC1 to MC16 may be coupled in series between the source select transistor SST and the drain select transistor DST. Gates of source select transistors SST included in different strings ST may be coupled to the source select line SSL, gates of drain select transistors DST included in different strings ST may be coupled to the drain select line DSL, and gates of the memory cells MC1 to MC16 included in different strings ST may be coupled to the plurality of word lines WL1 to WL16. A group of memory cells coupled to the same word line among the memory cells included in different strings ST may be referred as a page PPG. Therefore, pages PPG for which a number corresponds to that of the word lines WL1 to WL16 may be included in the memory block 110.

Figure 5:
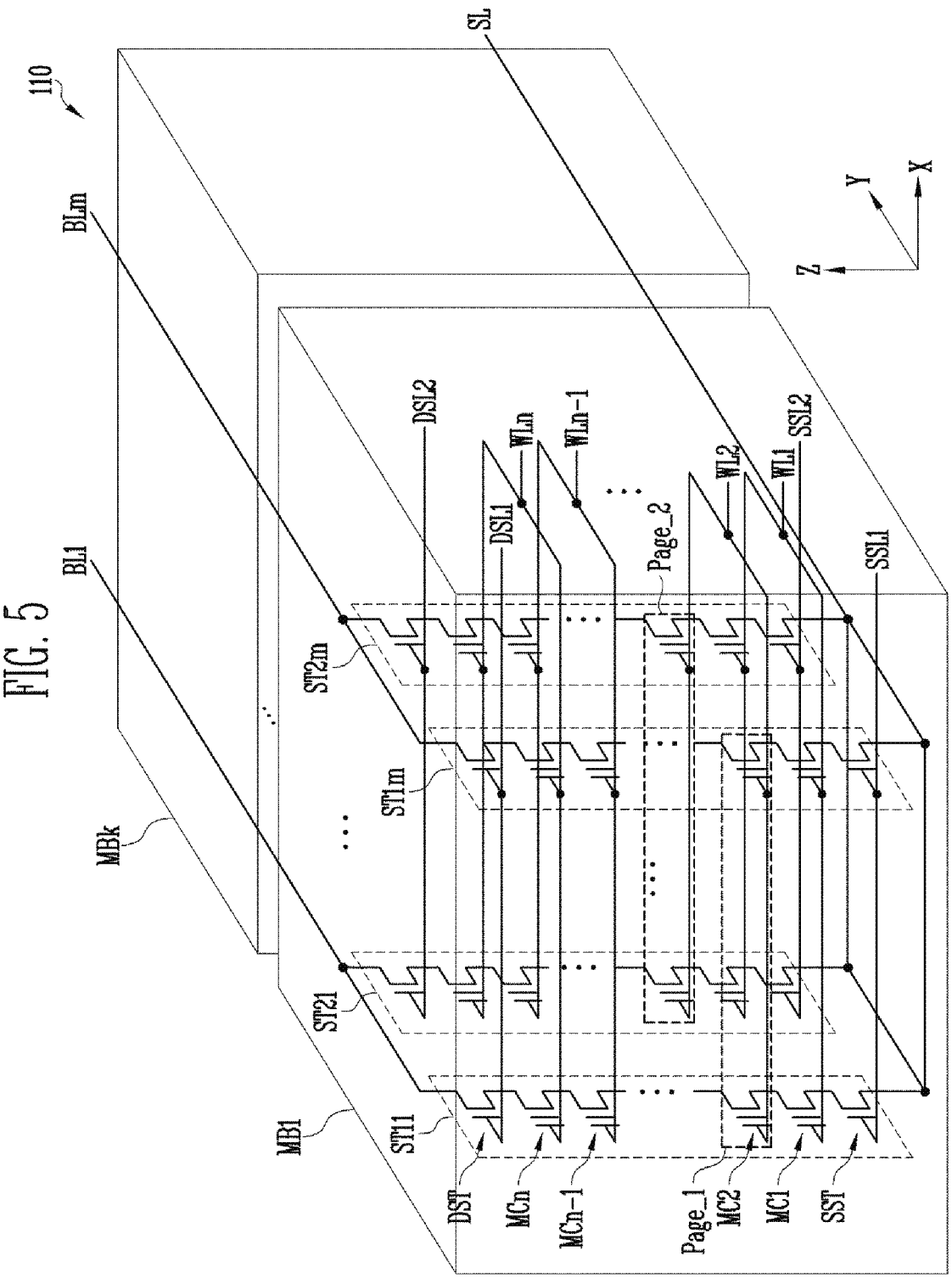
FIG. 5 is a diagram illustrating an embodiment of a three-dimensionally configured memory block.

FIG. 5 is a diagram illustrating an embodiment of a three-dimensionally configured memory block 110.

Referring to FIG. 5, the memory cell array 100 may include a plurality of memory blocks MB1 to MBk 110. The memory block 110 may include a plurality of strings ST11 to ST1m and ST21 to ST2m. Each of the plurality of strings ST11 to ST1m and ST21 to ST2m may extend along a vertical direction (Z direction). In the memory block 110, m strings may be arranged in a row direction (X direction). Although a case where two strings are arranged in a column direction (Y direction) is illustrated in FIG. 5, this is for convenience of description, and three or more strings may be arranged in the column direction (Y direction).

Each of the plurality of strings ST11 to ST1m and ST21 to ST2m may include at least one source select transistor SST, first to nth memory cells MC1 to MCn, and at least one drain select transistor DST.

The source select transistor SST of each string may be coupled between a source line SL and memory cells MC1 to MCp.

Source select transistors of strings arranged in the same row may be coupled to the same source select line. Source select transistors of strings ST11 to ST1m arranged on a first row may be coupled to a first source select line SSL1. Source select transistors of strings ST21 to ST2m arranged on a second row may be coupled to a second source select line SSL2. In another embodiment, the source select transistors of the strings ST11 to ST1m and ST21 to ST2m may be commonly coupled to one source select line.

The first to nth memory cells MC1 to MCn of each string may be coupled in series to each other between the source select transistor SST and the drain select transistor DST. Gates of the first to nth memory cells MC1 to MCn may be respectively coupled to first to nth word lines WL1 to WLn.

In an embodiment, at least one of the first to nth memory cells MC1 to MCn may be used as a dummy memory cell. When the dummy memory cell is provided, a voltage or current of a corresponding string can be stably controlled. Accordingly, the reliability of data stored in the memory block 110 can be improved.

The drain select transistor DST of each string may be coupled to a bit line and the memory cells MC1 to MCn. Drain select transistors DST of strings arranged in the row direction may be coupled to a drain select line extending in the row direction. Drain select transistors DST of the strings ST11 to ST1m on the first row may be coupled to a first drain select line DSL1. Drain select transistors DST of the strings ST21 to ST2m on the second row may be coupled to a second drain select line DSL2.

Each of the first to nth word lines WL1 to WLn may correspond to at least one page. For example, the second word line WL2 may correspond to a first page Page_1 including the second memory cells included in the strings ST11 to ST1m on the first row and a second page Page_2 including the second memory cells included in the strings ST21 to ST2m on the second row.

Figure 6:
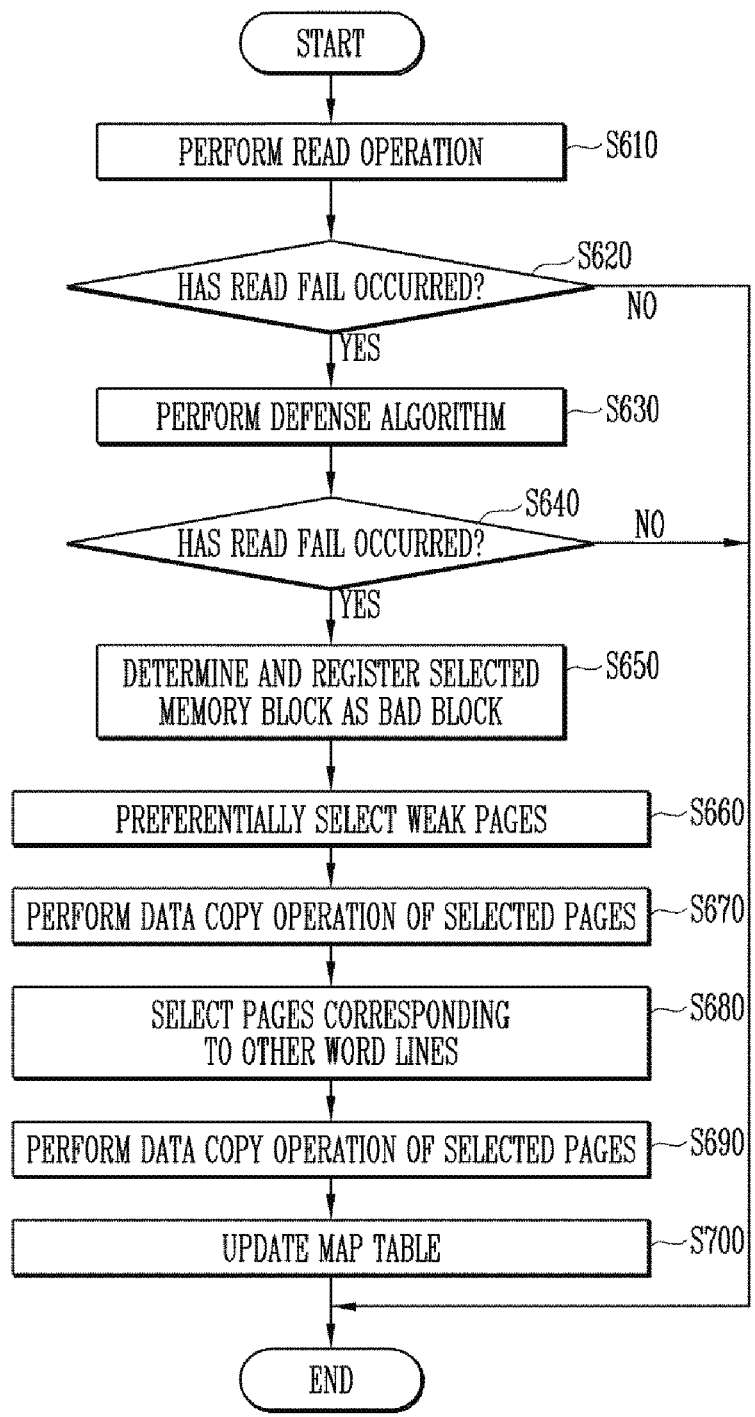
FIG. 6 is a flowchart illustrating an operating method of the memory system in accordance with an embodiment of the present disclosure.

FIG. 6 is a flowchart illustrating an operating method of a memory system in accordance with an embodiment of the present disclosure.

The operating method of FIG. 6 will be described with reference to FIGS. 1 to 6.

In an embodiment of the present disclosure, a case where valid data of a memory block in which a read fail occurs is moved and stored in a target block in a read operation of the memory device 1100 will be described.

When a read operation request is received from the host 2000, the memory controller 1200 transmits an internal command CMD corresponding to a read operation and an address ADD to a selected semiconductor memory among the plurality of semiconductor memories 1110 included in the memory device 1100.

The selected semiconductor memory performs the read operation on the selected memory block in response to the received internal command CMD and the received address ADD (S610). The selected semiconductor memory selects at least one memory block (e.g., MB1) among a plurality of memory blocks MB1 to MBk, and performs the read operation on selected pages among a plurality of pages included in the selected memory block MB1. The read operation may be performed in a unit of a page.

The page buffer group 230 senses data stored in memory cells included in one page (e.g., Page_1) among pages corresponding to a selected word line in the read operation, and the sensed data DATA is transmitted to the memory controller 1200 through the column decoder 230 and the input/output circuit 250.

The error corrector 1230 of the memory controller 1200 receives the data DATA from the memory device 1100 to perform an error correction operation, and determines whether a read fail has occurred with respect to the page on which the read operation has been performed (S620).

When it is determined in the above-described step S620 that the read fail has occurred (Yes), the defense algorithm controller 1211 of the memory block manager 1210 controls the memory device 1100 to perform a defense algorithm. The selected semiconductor memory of the memory device 1100 reads new data DATA by performing a defense algorithm such as an eBoost operation, a soft decoding operation, or a read retry operation of re-performing the read operation by changing a read voltage for the page in which the read fail has occurred, and transmits the read data DATA to the memory controller 1200 (S630). When the read fail does not occur in the above-described step S620, the read operation may be ended.

The error corrector 1230 of the memory controller 1230 receives the new data DATA from the semiconductor memory 1110 which has performed the defense algorithm to perform an error correction operation, and determines whether a read fail has occurred with respect to the page on which the defense algorithm has been performed, based on a result of the error correction operation (S640).

When it is determined in the above-described step S640 that the read fail has occurred (Yes), the bad block manager 1212 determines, as a bad block, the selected memory block MB1 including the page in which the read fail has occurred, and registers the memory block MB1 as the bad block (S650).

Subsequently, the memory controller 1200 controls the memory device 1100 to perform a data copy operation of moving valid data stored in the memory block MB1 determined as the bad block to a target block.

The data copy operation controller 1214 preferentially selects weak pages among a plurality of pages included in the memory block MB1 determined as the bad block (S660). The weak pages may be pages physically adjacent to the page in which the read fail has occurred. The weak pages may be pages which share the same word line as the page in which the read fail has occurred. The weak pages may be pages corresponding to word lines adjacent to the word line of the page in which the read fail has occurred. For example, when a read fail occurs in a first page Page_1 coupled to the third word line WL3, a second page Page_2 coupled to the third word line WL3, pages coupled to the second word line WL2, or pages coupled to the fourth word line WL4 may be determined as weak pages, to be preferentially selected in the data copy operation. The weak pages may be pages which share the same word line as the page in which the read fail has occurred and pages corresponding to word lines adjacent to the word line of the page in which the read fail has occurred.

In the embodiment of the present disclosure, there has been described a case where word lines adjacent to the word line of the page in which the read fail has occurred are only one word line disposed above the word line of the page in which the read fail has occurred and only one word line disposed under the word line of the page in which the read fail has occurred. However, the word lines adjacent to the word line of the page in which the read fail has occurred may be defined as at least one word line disposed above the word line of the page in which the read fail has occurred and at least one word line disposed under the word line of the page in which the read fail has occurred.

The data copy operation controller 1214 controls the memory device 1100 to perform a data copy operation on the pages determined as the weak pages to be preferentially selected. The semiconductor memory 1110 of the memory device 1100 performs a data copy operation of reading valid data stored in the selected pages of the memory block MB1 determined as the bad block and programming the read data in a target block in an erase state (S670).

The data read in the data copy operation may be transmitted to the error corrector 1230 of the memory controller 1200, and the error corrector 1230 may perform an error correction operation on the received data and then transmit the data on which the error correction operation has been performed to a semiconductor memory including a target block.

The valid data read from the weak pages are programmed from pages corresponding to a first word line (e.g., WL1) of the target block. For example, pages are selected from pages corresponding to a first word line (e.g., WL1) adjacent to the source line SL, and a program operation is performed on the selected pages. When the program operation of the pages corresponding to the first word line (e.g., WL1) is completed, the other valid data are programmed to pages corresponding to a next word line (e.g., WL2). That is, the valid data read from the weak pages are programmed to pages corresponding to word lines adjacent to the source lines among pages included in the target block.

The target block may be a memory block in the erase state, which is included in a semiconductor memory identical to that including the memory block MB1 determined as the bad block or a memory block in the erase state, which is included in a semiconductor memory different from that including the memory block MB1 determined as the bad block.

Subsequently, the data copy operation controller 1214 selects pages corresponding to the other word lines except the word lines of the weak pages (S680), and controls the memory device 1100 to perform a data copy operation on the selected pages.

The semiconductor memory 1110 of the memory device 1100 performs a data copy operation of reading valid data stored in the selected pages of the memory block MB1 determined as the bad block and storing the read data in the target block in the erase state (S690). The data read in the data copy operation may be transmitted to the error corrector 1230 of the memory controller 1200, and the error corrector 1230 may perform an error correction operation on the received data and then transmit the data on which the error correction operation has performed to the semiconductor memory including the target block. The valid data read from the other pages except the weak pages are stored in pages on which a program operation has not been performed among the pages included in the target block, and are programmed by sequentially selecting pages from pages corresponding to a word line adjacent to the source line among the pages on which the program operation has not been performed.

When the data copy operation is completed, the map table manager 1220 updates a changed physical address of the valid data (S700). For example, the map table manager 1220 changes the physical address of the valid data to a physical address including a block address and a page address of the target block, and updates the changed physical address.

As described above, in accordance with the embodiment of the present disclosure, when valid data of a memory block in which a read fail occurs in a read operation are stored in a target block by performing a data copy operation, pages physically adjacent to a page in which the read fail has occurred are defined as weak pages, and the valid data are stored in pages corresponding to word lines adjacent to a source line among pages of the target block by preferentially selecting the weak pages. Thus, the valid data are stored at the position of the page in which the read fail has occurred and the position of a changed page, so that the reliability of data can be improved.

Figure 7:
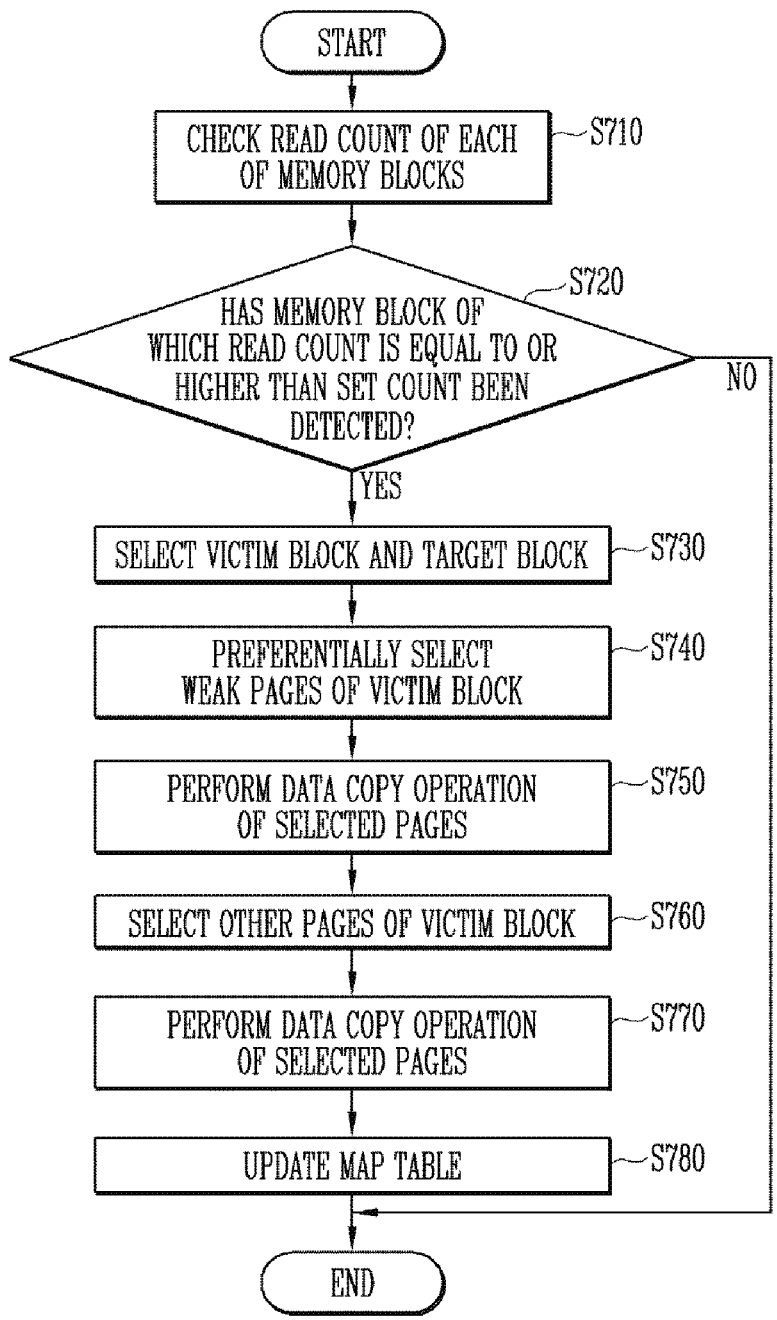
FIG. 7 is a flowchart illustrating an operating method of the memory system in accordance with another embodiment of the present disclosure.

FIG. 7 is a flowchart illustrating an operating method of a memory system in accordance with another embodiment of the present disclosure.

The operating method of FIG. 7 will be described with reference to FIGS. 1 to 5 and 7.

In the another embodiment of the present disclosure, a case where valid data stored in a victim block are moved and stored in a target block in a read reclaim operation of the memory device 1100 will be described.

The read reclaim controller 1213 of the memory controller 1200 checks a read count of each of the plurality of memory blocks MB1 to MBk included in the memory device 1100 (S710).

As a result of the above-described step S710, it is checked whether any memory block of which the read count is equal to or higher than a set count has been detected (S720).

When any memory block of which the read count is equal to or higher than a set count is detected in the above-described step S720 (Yes), the read reclaim controller 1213 selects, as a victim block, the detected memory block (e.g., MB1) so as to perform a read reclaim operation, and selects, as a target block, one (e.g., MB2) of memory blocks in an erase state among the plurality of memory blocks MB1 to MBk included in the memory device 1100 (S730). When any memory block of which the read count is equal to or higher than a set count is not detected in the above-described step S720 (No), the operating method may be ended without performing the read reclaim operation.

The memory controller 1200 controls the memory device 1100 to perform a data copy operation of moving valid data stored in the memory block MB1 selected as the victim block to the target block MB2.

The data copy operation controller 1214 preferentially selects weak pages among a plurality of pages included in the victim block MB1 (S740). The weak pages may be pages corresponding to an upper end portion of strings ST among the plurality of pages. For example, the weak pages may be pages corresponding to at least one word line adjacent to the bit lines BL1 to BLm. The weak pages may be pages corresponding to a lower end portion of the strings ST among the plurality of pages. For example, the weak pages may be pages corresponding to at least one word line adjacent to the source line SL. The weak pages may be pages corresponding to upper and lower end portions of the strings ST among the plurality of pages. For example, the weak pages may be pages corresponding to at least one word line adjacent to the bit lines BL1 to BLm and pages corresponding to at least one word line adjacent to the source line SL.

In the embodiment of the present disclosure, for convenience of description, a case where pages corresponding to the first word line WL1 and pages corresponding to the nth word line WLn are defined as the weak pages will be described.

The data copy operation controller 1214 controls the memory device 1100 to perform a data copy operation on pages determined as the weak pages to be preferentially selected. The semiconductor memory 1110 of the memory device 1100 performs a data copy operation of reading valid data stored in the selected pages of the victim block MB1 and programming the read data to the target block MB2 in the erase state (S750). The data read in the data copy operation may be transmitted to the error corrector 1230 of the memory controller 1200, and the error corrector 1230 may perform an error correction operation on the received data and then transmit the data on which the error correction operation has been performed to a semiconductor memory including the target block. The valid data read from the weak pages are programmed from pages corresponding to a first word line (e.g., WL1) of the target block. For example, pages are selected from pages corresponding to a first word line (e.g., WL1) adjacent to the source line SL, and a program operation is performed on the selected pages. When the program operation of the pages corresponding to the first word line (e.g., WL1) is completed, the other valid data are programmed to pages corresponding to a next word line (e.g., WL2). That is, the valid data read from the weak pages are programmed to pages corresponding to word lines adjacent to the source lines among pages included in the target block.

The target block MB2 may be a memory block in the erase state, which is included in a semiconductor memory identical to that including the victim block MB1 or a memory block in the erase state, which is included in a semiconductor memory different from that including the victim block MB1 among the plurality of semiconductor memories included in the memory device 1100.

Subsequently, the data copy operation controller 1214 selects pages corresponding to the other word lines WL2 to WLn−1 except the word lines of the weak pages in the victim block MB1 (S760), and controls the memory device 1100 to a data copy operation on the selected pages.

The semiconductor memory 1110 of the memory device 1100 performs a data copy operation of reading valid data stored in the selected pages of the victim block MB1 and storing the read data in the target block MB2 in the erase state (S770). The data read in the data copy operation may be transmitted to the error corrector 1230 of the memory controller 1200, and the error corrector 1230 may perform an error correction operation on the received data and then transmit the data on which the error correction operation has been performed to the semiconductor memory including the target block. The valid data read from the other pages except the weak pages are stored in pages on which a program operation has not been performed among the pages included in the target block, and are programmed by sequentially selecting pages from pages corresponding to a word line adjacent to the source line among the pages on which the program operation has not been performed.

When the data copy operation is completed, the map table manager 1220 updates a changed physical address of the valid data (S780). For example, the map table manager 1220 changes the physical address of the valid data to a physical address including a block address and a page address of the target block, and updates the changed physical address.

As described above, in accordance with the embodiment of the present disclosure, when valid data of a victim block are stored in a target block by performing a data copy operation in a read reclaim operation, pages adjacent to a source line or a bit line among pages of the victim block are defined as weak pages, and valid data stored in the weak pages are stored in pages corresponding to word lines adjacent to the source line among pages of the target block by preferentially selecting the weak pages, so that the reliability of data can be improved.

Figure 8:
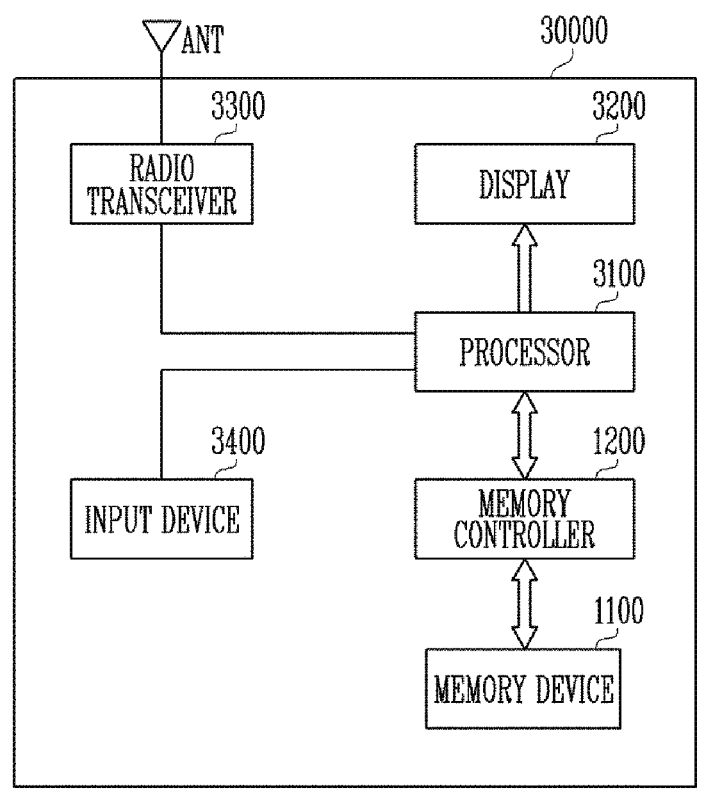
FIG. 8 is a diagram illustrating another embodiment of the memory system.

FIG. 8 is a diagram illustrating another embodiment of a memory system 30000 in accordance with the present disclosure.

Referring to FIG. 8, the memory system 30000 may be implemented as a cellular phone, a smart phone, a tablet PC, a personal digital assistant (PDA), or a wireless communication device. The memory system 30000 may include a memory device 1100 and a memory controller 1200 capable of controlling an operation of the memory device 1100. The memory controller 1200 may control a data access operation of the memory device 1100, e.g., a program operation, an erase operation, a read operation, or the like under the control of a processor 3100.

Data programmed in the memory device 1100 may be output through a display 3200 under the control of the memory controller 1200. The memory device 1100 may be configured and operated identically to the memory device 1100 shown in FIG. 1, and the memory controller 1200 may be configured and operated identically to the controller 1200 shown in FIG. 1.

A radio transceiver 3300 may transmit/receive radio signals through an antenna ANT. For example, the radio transceiver 3300 may change a radio signal received through the antenna ANT into a signal that can be processed by the processor 3100. Therefore, the processor 3100 may process a signal output from the radio transceiver 3300 and transmit the processed signal to the memory controller 1200 or the display 3200. The memory controller 1200 may transmit the signal processed by the processor 3100 to the memory device 1100. Also, the radio transceiver 3300 may change a signal output from the processor 3100 into a radio signal, and output the changed radio signal to an external device through the antenna ANT. An input device 3400 is a device capable of inputting a control signal for controlling an operation of the processor 3100 or data to be processed by the processor 3100, and may be implemented as a pointing device such as a touch pad or a computer mount, a keypad, or a keyboard. The processor 3100 may control an operation of the display 3200 such that data output from the memory controller 1200, data output from the radio transceiver 3300, or data output from the input device 3400 can be output through the display 3200.

In some embodiments, the memory controller 1200 capable of controlling an operation of the memory device 1100 may be implemented as a part of the processor 3100, or be implemented as a chip separate from the processor 3100.

Figure 9:
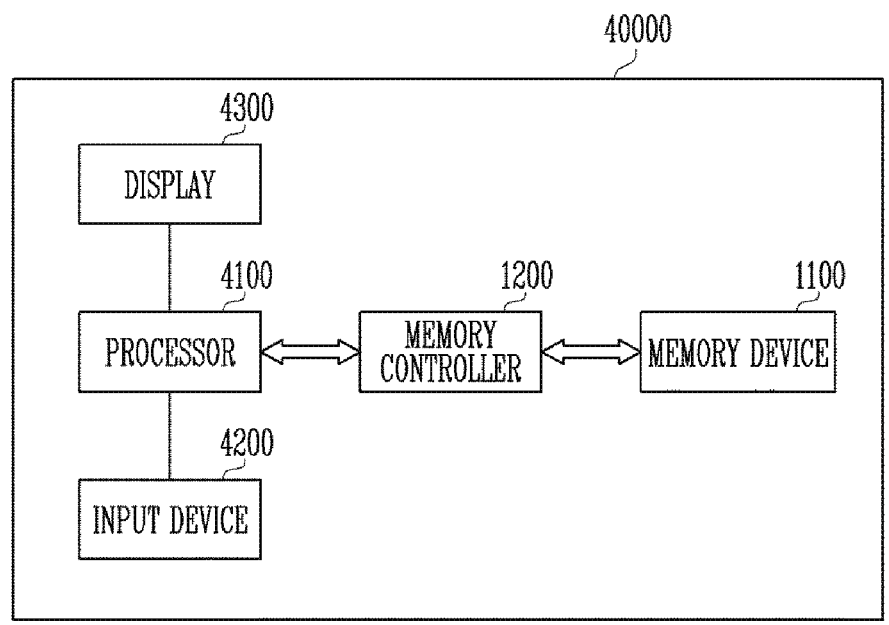
FIG. 9 is a diagram illustrating another embodiment of the memory system.

FIG. 9 is a diagram illustrating another embodiment of a memory system 40000 in accordance with the present disclosure.

Referring to FIG. 9, the memory system 40000 may be implemented as a personal computer (PC), a tablet PC, a net-book, an e-reader, a personal digital assistant (PDA), a portable multi-media player (PMP), an MP3 player, or an MP4 player.

The memory system 40000 may include a memory device 1100 and a memory controller 1200 capable of controlling a data processing operation of the memory device 1100. The memory device 1100 may be configured and operated identically to the memory device 1100 shown in FIG. 1, and the memory controller 1200 may be configured and operated identically to the controller 1200 shown in FIG. 1.

A processor 4100 may output data stored in the memory device 1100 through a display 4300 according to data input through an input device 4200. For example, the input device 4200 may be implemented as a pointing device such as a touch pad or a computer mouse, a keypad, or a keyboard.

The processor 4100 may control overall operations of the memory system 40000, and control an operation of the memory controller 1200. In some embodiments, the memory controller 1200 capable of controlling an operation of the memory device 1100 may be implemented as a part of the processor 4100, or be implemented as a chip separate from the processor 4100.

Figure 10:
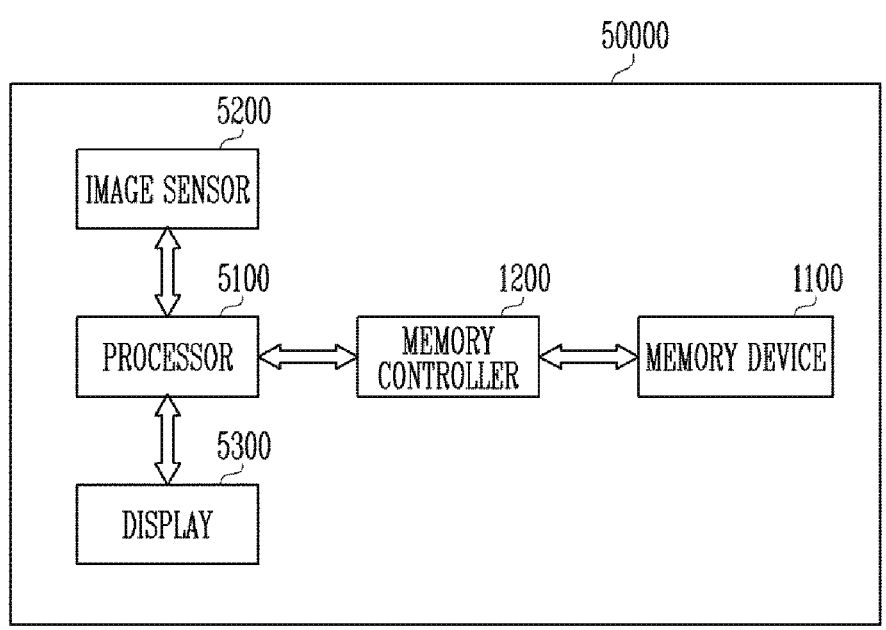
FIG. 10 is a diagram illustrating another embodiment of the memory system.

FIG. 10 is a diagram illustrating another embodiment of a memory system 50000 in accordance with the present disclosure.

Referring to FIG. 10, the memory system 50000 may be implemented as an image processing device, e.g., a digital camera, a mobile terminal having a digital camera attached thereto, a smart phone having a digital camera attached thereto, or a tablet PC having a digital camera attached thereto.

The memory system 50000 may include a memory device 1100 and a memory controller 1200 capable of controlling a data processing operation of the memory device 1100, e.g., a program operation, an erase operation, or a read operation. The memory device 1100 may be configured and operated identically to the memory device 1100 shown in FIG. 1, and the memory controller 1200 may be configured and operated identically to the controller 1200 shown in FIG. 1.

An image sensor 5200 of the memory system 50000 may convert an optical image into digital signals, and the converted digital signals may be transmitted to a processor 5100 or the memory controller 1200. Under the control of the processor 5100, the converted digital signals may be output through a display 5300, or be stored in the memory device 1100 through the memory controller 1200. In addition, data stored in the memory device 1100 may be output through the display 5300 under the control of the processor 5100 or the memory controller 1200.

In some embodiments, the memory controller 1200 capable of controlling an operation of the memory device 1100 may be implemented as a part of the processor 5100, or be implemented as a chip separate from the processor 5100.

Figure 11:
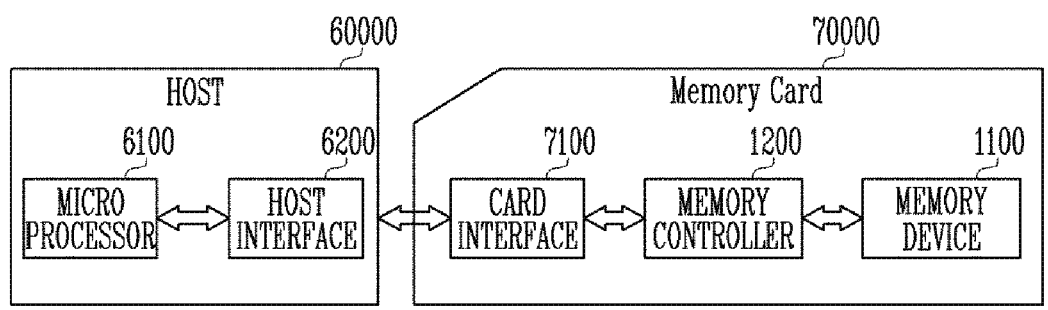
FIG. 11 is a diagram illustrating another embodiment of the memory system.

FIG. 11 is a diagram illustrating another embodiment of a memory system 70000 in accordance with the present disclosure.

Referring to FIG. 11, the memory system 70000 may be implemented as a memory card or a smart card. The memory system 70000 may include a memory device 1100, a memory controller 1200, and a card interface 7100. The memory device 1100 may be configured and operated identically to the memory device 1100 shown in FIG. 1, and the memory controller 1200 may be configured and operated identically to the controller 1200 shown in FIG. 1.

The memory controller 1200 may control data exchange between the memory device 1100 and the card interface

7100. In some embodiments, the card interface 7100 may be a secure digital (SD) card interface or a multi-media card (MMC) interface, but the present disclosure is not limited thereto.

The card interface 7100 may interface data exchange between a host 60000 and the memory controller 1200 according to a protocol of the host 60000. In some embodiments, the card interface 7100 may support a universal serial bus (USB) protocol and an inter-chip (IC)-USB protocol. The card interface 7100 may mean hardware capable of supporting a protocol used by the host 60000, software embedded in the hardware, or a signal transmission scheme.

When the memory system 70000 is coupled to a host interface 6200 of the host 60000 such as a PC, a tablet PC, a digital camera, a digital audio player, a cellular phone, console video game hardware, or a digital set-top box, the host interface 6200 may perform data communication with the memory device 1100 through the card interface 7100 and the memory controller 1200 under the control of a microprocessor 6100.

In accordance with the present disclosure, when valid data stored in a memory block are moved and stored in another memory block, pages weak to a disturb phenomenon are preferentially selected and moved, so that the reliability of data can be improved.

While the present disclosure has been shown and described with reference to certain embodiments thereof, it will be understood by those skilled in the art that various changes in form and details may be made therein without departing from the spirit and scope of the present disclosure as defined by the appended claims and their equivalents. Therefore, the scope of the present disclosure should not be limited to the above-described embodiments but should be determined by not only the appended claims but also the equivalents thereof.

In the above-described embodiments, all steps may be selectively performed or part of the steps and may be omitted. In each embodiment, the steps are not necessarily performed in accordance with the described order and may be rearranged. The embodiments disclosed in this specification and drawings are only examples to facilitate an understanding of the present disclosure, and the present disclosure is not limited thereto. That is, it should be apparent to those skilled in the art that various modifications can be made on the basis of the technological scope of the present disclosure.

Meanwhile, the embodiments of the present disclosure have been described in the drawings and specification. Although specific terminologies are used here, those are only to explain the embodiments of the present disclosure. Therefore, the present disclosure is not restricted to the above-described embodiments and many variations are possible within the spirit and scope of the present disclosure. It should be apparent to those skilled in the art that various modifications can be made on the basis of the technological scope of the present disclosure in addition to the embodiments disclosed herein.

What is claimed is:

1. A memory system comprising:
a memory device including a plurality of memory blocks, wherein each of the plurality of memory blocks comprises a plurality of word lines arranged in parallel between a source line and a drain select line; and
a memory controller configured to:
transmit an internal command and address to a selected semiconductor memory corresponding to a read operation request received from a host;
perform a read operation on a selected page of a selected memory block of the plurality of memory blocks in response to the received internal command and address;
determine whether a read fail has occurred on the selected page;
register the selected memory block as a bad block in response to determining that a read fail has occurred;
determine weak pages among a plurality of pages included in the selected memory block, wherein the weak pages comprise at least one of first pages which share a word line with the page in which the read fail has occurred and second pages which correspond to word lines adjacent to a word line of the page in which the read fail has occurred;
read valid data from the weak pages of the bad block and program the valid data read from the weak pages to pages corresponding to a word line adjacent to the source line a target block; and
read valid data from other pages except the weak pages of the bad block and program the valid data from the other pages except the weak pages to pages on which a program operation has not been performed among the pages included in the target block, wherein the valid data from the other pages except the weak pages are programmed by sequentially selecting pages from pages corresponding to a word line adjacent to the source line among the pages on which the program operation has not been performed in the target block.

2. The memory system of claim 1, wherein the memory controller is configured to control the memory device to program the valid data from the other pages except the weak pages of the bad block after programming the valid data from the weak pages of the bad block.

3. The memory system of claim 1, wherein the memory controller is configured to:
control the memory device to perform a read reclaim operation, when a read count of the selected memory block is equal to or higher than a set count; and
control the memory device to program the valid data read from the weak pages of the bad block and the valid data read from the other pages except the weak pages of the bad block to the target block in the read reclaim operation.

4. The memory system of claim 3, wherein, in the read reclaim operation, the memory controller is configured to determine the selected memory block as a victim block, and set, as the weak pages, at least one third page adjacent to a bit line among the plurality of pages included in the victim block, at least one fourth page adjacent to a source line, or the third and fourth pages.

5. The memory system of claim 1, wherein the memory device comprises a plurality of semiconductor memories,
wherein the selected memory block and the target block are included together in one semiconductor memory among the plurality of semiconductor memories, or are included in different semiconductor memories.

6. The memory system of claim 1, wherein the memory controller incudes a map table manager circuit configured to store a map table for matching logical and physical addresses of the plurality of memory blocks,
wherein the map table manager circuit is further configured to update, in the map table, mapping information between the logical and physical addresses, which is changed after programing the valid data read from the weak pages of the bad block to the target block and programing the valid data read from the other pages except the weak pages of the bad block to the target block is performed.

7. A method for operating a memory system comprising a memory device including a plurality of memory blocks, wherein each of the plurality of memory blocks comprises a plurality of word lines arranged in parallel between a source line and a drain select line, the method comprising:

transmitting an internal command and address to a selected semiconductor memory corresponding to a read operation request received from a host;

performing a read operation on a selected page of a selected memory block of the plurality of memory blocks in response to the received internal command and address;

determining whether a read fail has occurred on the selected page;

registering the selected memory block as a bad block in response to determining that a read fail has occurred;

determining weak pages among a plurality of pages included in the selected memory block, wherein the weak pages comprise at least one of first pages which share a word line with the page in which the read fail has occurred and second pages which correspond to word lines adjacent to a word line of the page in which the read fail has occurred;

reading valid data from the weak pages of the bad block and programing the valid data read from the weak pages to pages corresponding to a word line adjacent to the source line a target block; and reading valid data from other pages except the weak pages and programing the valid data from the other pages except the weak pages to pages on which a program operation has not been performed among the pages included in the target block, wherein the valid data from the other pages except the weak pages are programmed by sequentially selecting pages from pages corresponding to a word line adjacent to the source line among the pages on which the program operation has not been performed in the target block.

8. The method of claim 7, further comprising, after programing the valid data read from the weak pages of the bad block and programming the valid data read from the other pages except the weak pages of the bad block, updating mapping information of the valid data read from the weak pages and the valid data read from the other pages except the weak pages.

\* \* \* \* \*